United States Patent
Nguyen et al.

(10) Patent No.: US 7,859,918 B1
(45) Date of Patent: Dec. 28, 2010

(54) METHOD AND APPARATUS FOR TRIMMING DIE-TO-DIE VARIATION OF AN ON-CHIP GENERATED VOLTAGE REFERENCE

(75) Inventors: Leon L. Nguyen, San Jose, CA (US); Martin L. Voogel, Los Altos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/577,502

(22) Filed: Oct. 12, 2009

(51) Int. Cl.
*G11C 7/00* (2006.01)
(52) U.S. Cl. .................. 365/189.09; 365/210; 365/226
(58) Field of Classification Search ............ 365/189.16, 365/210, 201, 225.7, 189.09, 226; 327/539
See application file for complete search history.

(56) References Cited

U.S. PATENT DOCUMENTS 6,917,188 B2 * 7/2005 Kernahan .................. 323/282
6,943,617 B2 * 9/2005 Tran et al. .................. 327/539
7,751,783 B2 * 7/2010 Ouzillou et al. .......... 455/115.1

* cited by examiner

*Primary Examiner*—Son Dinh
(74) *Attorney, Agent, or Firm*—Michael T. Wallace

(57) ABSTRACT

A method and apparatus is provided for the implementation of a measurement and adjustment mechanism within a semiconductor die that facilitates adjustment of the magnitude of voltage generated by one or more voltage reference generation circuits on the die. In a first embodiment, the output voltage magnitude of a bandgap reference circuit may be measured and adjusted. In a second embodiment, the output voltage magnitude of a voltage regulator circuit may be measured and adjusted. Programmable circuit elements, such as programmable resistors, may first be programmed during a configuration event of the die to determine the optimal configuration settings of the one or more voltage reference generation circuits. The optimal configuration settings are then used to program the state of one or more eFuses to maintain the optimal configuration settings for the duration of the semiconductor die's lifetime.

20 Claims, 6 Drawing Sheets

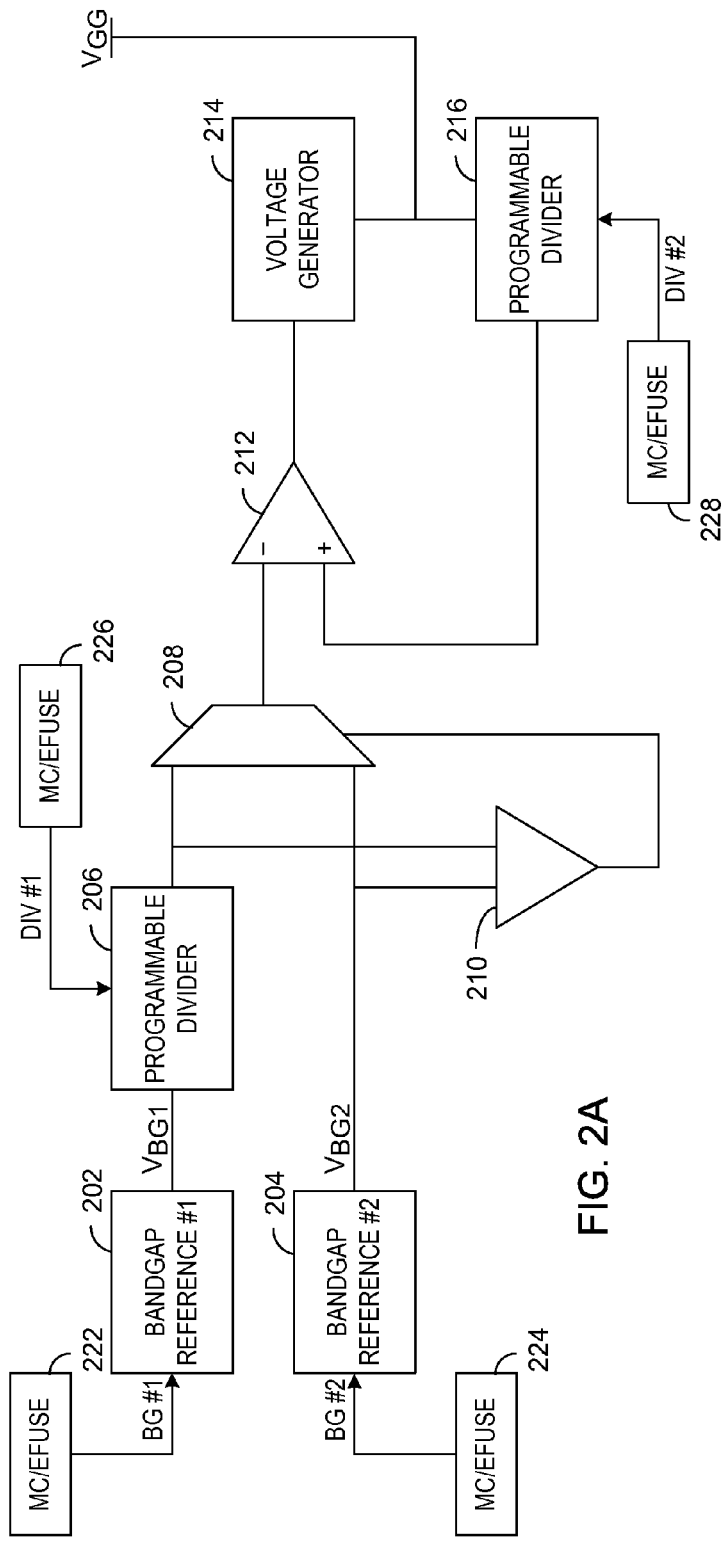
FIG. 2A
FIG. 2B
FIG. 2C

METHOD AND APPARATUS FOR TRIMMING DIE-TO-DIE VARIATION OF AN ON-CHIP GENERATED VOLTAGE REFERENCE

FIELD OF THE INVENTION

The present invention generally relates to integrated circuits (ICs), and more particularly to ICs configured to facilitate trimming of die-to-die variations of voltage reference signals generated on the die.

BACKGROUND

PLDs are a well-known type of integrated circuit that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, clock managers, Delay Lock Loops (DLLs), Multi-Gigabit Transceivers (MGTs) and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells that define how the programmable elements are configured. The configuration data may be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to Input/Output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these PLDs, the functionality of the device is determined by the data bits used to configure the reconfigurable resources of the device. The data bits can be stored in volatile memory (e.g., static memory cells, as in FPGAs and some CPLDs), in non-volatile memory (e.g., FLASH memory, as in some CPLDs), or in any other type of memory cell.

Some PLDs, such as the Xilinx Virtex® FPGA available from Xilinx, Inc. of San Jose, Calif., can be programmed to incorporate blocks with pre-designed functionalities, i.e., "cores". A core can include a predetermined set of configuration bits that program the FPGA to perform one or more functions. Alternatively, a core can include source code or schematics that describe the logic and connectivity of a design. Typical cores can provide, but are not limited to, DSP functions, memories, storage elements, and math functions. Some cores include an optimally floor planned layout targeted to a specific family of FPGAs. Cores can also be parameterizable, i.e., allowing the user to enter parameters to activate or change certain core functionality.

Since PLDs are implemented on a single substrate using integrated circuit (IC) processing, PLD performance is somewhat dependent upon process variation. As such, voltage reference circuits, such as bandgap reference circuits and regulated voltage reference circuits, exhibit variation in the magnitude of voltages generated. In order to account for the process-induced variations, therefore, the voltage reference circuits are designed to produce a derated voltage magnitude that is lower or higher than the optimum voltage magnitude. Due to process-induced variations, derated voltage reference circuits are not optimized, which degrades performance of the PLD and creates uncertainty as to the level of performance that may be achieved from the PLD across all process, voltage, and temperature corners.

Thus, a need exists to facilitate the measurement and adjustment of process related variations in on-chip voltage reference circuits.

SUMMARY

To overcome limitations in the prior art, and to overcome other limitations that will become apparent upon reading and understanding the present specification, various embodiments of the present invention disclose an apparatus and method for measuring and adjusting die-to-die variations in on-chip voltage reference circuits.

In accordance with one embodiment of the invention, a method of programming a voltage reference circuit within an integrated circuit comprises obtaining a target voltage magnitude, performing a boundary scan to measure an actual voltage magnitude generated by the voltage reference circuit, iterating a configuration bit setting of the integrated circuit to program the actual voltage magnitude generated by the voltage reference circuit to within an acceptable error magnitude as compared to the target voltage magnitude, and programming an eFuse with the iterated configuration bit setting to permanently program the actual voltage magnitude to within the acceptable error magnitude.

In this embodiment, obtaining a target voltage magnitude can comprise using a lookup table indexed to a current operational temperature of the integrated circuit to find the target voltage magnitude. The method can further comprise selecting one voltage reference circuit from a plurality of voltage reference circuits to be programmed, where the selection is based upon the current operational temperature of the integrated circuit. The performing a boundary scan to measure an actual voltage magnitude generated by the voltage reference circuit can comprise utilizing a test access port to measure the voltage magnitude generated by the selected voltage reference circuit. The iterating a configuration bit setting of the integrated circuit to program the actual voltage magnitude generated by the voltage reference circuit can comprise comparing the voltage magnitude generated by the selected voltage reference circuit to the target voltage magnitude to determine an error magnitude. The iterating a configuration bit setting of the integrated circuit to program the actual voltage magnitude generated by the voltage reference circuit can further comprise determining whether a programming resolution of the selected voltage reference circuit is less than the error magnitude.

In this embodiment, the iterating a configuration bit setting of the integrated circuit to program the actual voltage magnitude generated by the voltage reference circuit can further comprise dividing the error magnitude by the programming resolution of the selected voltage reference circuit to determine a subsequent configuration bit setting. The iterating a configuration bit setting of the integrated circuit to program the actual voltage magnitude generated by the voltage reference circuit can further comprise configuring the integrated circuit with the subsequent configuration bit setting to reprogram the selected voltage reference circuit. The programming an eFuse with the iterated configuration bit setting to permanently program the actual voltage magnitude to within the acceptable error magnitude can comprise using the subsequent configuration bit setting to program an eFuse associated with the selected voltage reference circuit. The eFuse associated with the first voltage reference circuit can be programmed to select a tap point along a resistor array to program the actual voltage magnitude generated by the selected voltage reference circuit.

In accordance with another embodiment of the invention, a voltage regulation circuit comprises a first bandgap reference that is configured to provide a first bandgap voltage having a first temperature characteristic, the first temperature characteristic being programmed by a first configuration bit setting. The voltage regulation circuit further comprises a second bandgap reference that is configured to provide a second bandgap voltage having a second temperature characteristic, the second temperature characteristic being programmed by a second configuration bit setting. The voltage regulation circuit further comprises a selection circuit that is coupled to the first and second bandgap references, the selection circuit configured to select the first bandgap voltage when a temperature of the voltage regulation circuit is below a threshold temperature and select the second bandgap voltage when the temperature of the voltage regulation circuit is above the threshold temperature. The voltage regulation circuit further comprises a regulator that is coupled to receive the selected bandgap voltage and is configured to regulate an output voltage of the regulator circuit to be proportional to the selected bandgap voltage.

In this embodiment, the first bandgap reference can comprise: a first programmable divider coupled to receive a first regulated supply voltage and a first reference voltage and configured to provide a first divided voltage in response to the first configuration bit setting, the first divided voltage having a magnitude that is lower than a magnitude of the first regulated supply voltage and higher than a magnitude of the first reference voltage; and a first operational amplifier coupled to receive the first divided voltage and a second reference voltage and configured to provide a first feedback signal to regulate the first regulated supply voltage. The second bandgap reference can comprise: a second programmable divider coupled to receive a second regulated supply voltage and a third reference voltage and configured to provide a second divided voltage in response to the second configuration bit setting, the second divided voltage having a magnitude that is lower than the second regulated supply voltage and higher than the third reference voltage; and a second operational amplifier coupled to receive the second divided voltage and a fourth reference voltage and configured to provide a second feedback signal to regulate the second regulated supply voltage.

In this embodiment, the voltage regulation circuit can further comprise a third programmable divider coupled to receive the first bandgap voltage and configured to multiply the first bandgap voltage by a gain factor in response to a third configuration bit setting. The selection circuit can comprise: a comparator coupled to receive the first and second bandgap voltages and configured to provide a control signal in response to a comparison of the first and second bandgap voltages; and a multiplexer coupled to receive the first and second bandgap voltages and the control signal and configured to select one of the first and second bandgap voltages to be provided at an output of the multiplexer in response to the control signal. The regulator can comprise: a third operational amplifier coupled to receive the selected bandgap voltage at a first input and a feedback signal at a second input and configured to provide an error signal in response to a difference between a magnitude of the selected bandgap voltage and a magnitude of the feedback signal; a voltage generator coupled receive the error signal and configured to provide the regulated output voltage in response to the error signal; and a fourth programmable divider coupled to receive the regulated output voltage and configured to multiply the regulated output voltage by a gain factor in response to a fourth configuration bit setting. The voltage regulation circuit can further comprise first, second, third, and fourth memory cells configured to provide the first, second, third, and fourth configuration bit settings during iterated configuration events. In addition, the voltage regulation circuit can further comprise first, second, third, and fourth eFuses configured to provide the first, second, third, and fourth configuration bit settings during final operation of the voltage regulation circuit.

In accordance with another embodiment of the invention, a method of programming on-chip voltage generation circuits comprises programming a first bandgap reference to generate a first bandgap signal exhibiting a substantially neutral temperature characteristic, programming a second bandgap reference to generate a second bandgap signal exhibiting a substantially negative temperature characteristic, programming a magnitude of the first bandgap signal to be equal to a magnitude of the second bandgap signal when the temperature reaches a threshold temperature, regulating an output voltage in proportion to the first bandgap signal when the temperature is less than the threshold temperature, and regulating the output voltage in proportion to the second bandgap signal when the temperature is greater than the threshold temperature. In this embodiment, the method can further comprise programming a regulation gain when regulating the output voltage to the first and second reference signals.

BRIEF DESCRIPTION OF THE DRAWINGS

Various aspects and advantages of the invention will become apparent upon review of the following detailed description and upon reference to the drawings in which:

FIG. 2A illustrates a voltage regulation architecture implemented within the FPGA architecture of FIG. 1;

FIG. 2B illustrates temperature characteristics of bandgap references implemented within the voltage regulation architecture of FIG. 2A;

FIG. 2C illustrates the bandgap reference signals selected for regulation by the voltage regulation architecture of FIG. 2A;

DETAILED DESCRIPTION

Figure 1:
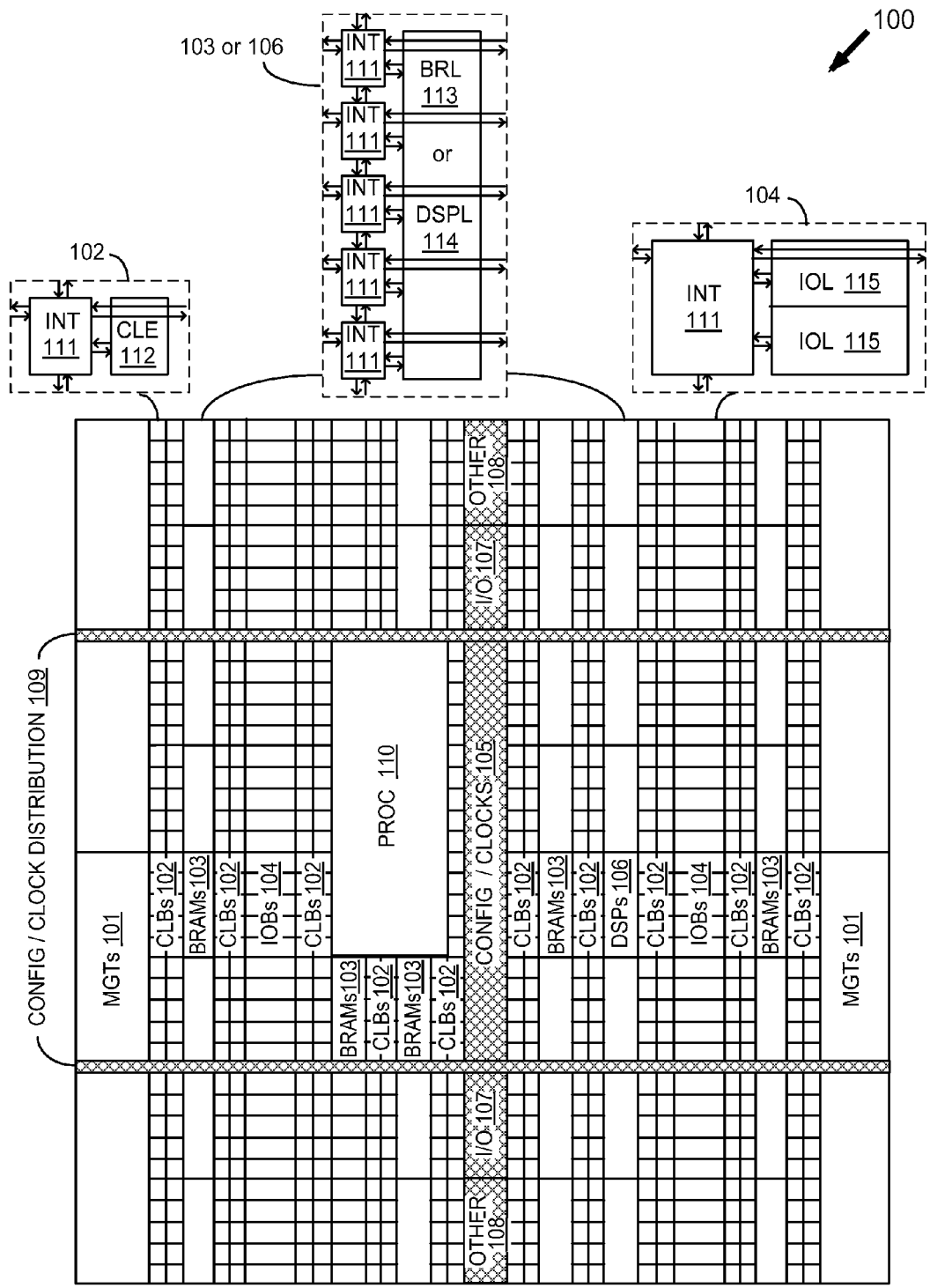
FIG. 1 illustrates an exemplary Field Programmable Gate Array (FPGA) architecture.

Generally, various embodiments of the present invention are applied to the field of integrated circuits (ICs) of which PLDs are a subset. In particular, a method and apparatus is provided for the implementation of a measurement and adjustment mechanism within a semiconductor die (die) that facilitates the ability to adjust the magnitude of voltage generated by one or more voltage reference generation circuits on the die.

In a first embodiment, the output voltage magnitude of a first bandgap reference circuit may be ascertained during execution of a boundary scan executed either during wafer sort or final test of the die. The output voltage magnitude of the first bandgap reference may then be compared to a first target magnitude to determine an amount of error existing between the measured output voltage magnitude of the first bandgap reference and the first target magnitude.

A programmable circuit element, such as a programmable resistor, may then be programmed during a configuration event of the die, whereby a configuration bitstream downloaded into the configuration memory space of the die reprograms the programmable resistor to cause the output voltage magnitude of the first bandgap reference circuit to change. The output voltage magnitude generated by the first bandgap reference may then be remeasured to determine an amount of error remaining between the measured output voltage magnitude of the first bandgap reference and the first target magnitude. The boundary scan measurement/configuration process may be iterated over a temperature range until the measured output voltage magnitude of the first bandgap reference is within a predetermined error threshold across the temperature range.

The control bits that are used to configure the programmable resistor are then used to program the state of a first eFuse. The JTAG interface, for example, may be used to program the state of the first eFuse to permanently configure the programmable resistor for optimized operation of the first bandgap reference as ascertained during the measurement/configuration iterations discussed above. The process may be repeated for any additional bandgap references that may exist on the die.

In a second embodiment, the output voltage magnitude of a first voltage regulator circuit may be ascertained during execution of a boundary scan executed either during wafer sort or final test of the die. The output voltage magnitude generated by the first voltage regulator may then be compared to a second target magnitude to determine an amount of error existing between the measured output voltage magnitude of the first voltage regulator and the second target magnitude.

A programmable circuit element, such as a programmable resistor, may then be programmed during a configuration event of the die, whereby a configuration bitstream downloaded into the configuration memory space of the die reprograms the programmable resistor to cause the output voltage magnitude of the first voltage regulator to change. The output voltage magnitude generated by the first voltage regulator may then be remeasured to determine an amount of error remaining between the measured output voltage magnitude of the first voltage regulator and the second target magnitude. The boundary scan measurement/configuration process may be iterated over a temperature range until the measured output voltage magnitude of the first voltage regulator is within a predetermined error threshold across the temperature range.

The control bits that are used to program the programmable resistor are then used to program the state of a second eFuse. A JTAG interface, for example, may be used to program the state of the second eFuse to permanently configure the programmable resistor to optimize operation of the first voltage regulator as ascertained during the measurement/configuration iterations discussed above. The process may be repeated for any additional voltage regulators that may exist on the die.

Through utilization of iterated boundary scan and configuration events, the voltage characteristic curves of a plurality of voltage reference circuits may be programmed during wafer sort or final test to facilitate optimized performance of the die. As a result, process-dependent variation in die performance characteristics may be substantially eliminated to produce a plurality of die that are substantially matched and optimized.

FIG. 1 exemplifies a die having process-dependent performance characteristics. The die of FIG. 1 hosts an integrated circuit such as a FPGA architecture 100, including a large number of different programmable tiles such as Multi-Gigabit Transceivers (MGTs) 101, CLBs 102, BRAMs 103, IOBs 104, configuration and clocking logic CONFIG/CLOCKS 105, DSPs 106, specialized I/O 107, including configuration ports and clock ports, and other programmable logic 108, such as digital clock managers, analog-to-digital converters, system monitoring logic, and so forth.

In some FPGAs, each programmable tile includes programmable interconnect element INT 111 having standardized connections to and from a corresponding interconnect element in each adjacent tile. Therefore, the programmable interconnect elements taken together implement the programmable interconnect structure for the illustrated FPGA. INT 111 also includes the connections to and from the programmable logic element within the same tile, as shown by the examples of blocks 102 and 104. For example, a CLB 102 may include a Configurable Logic Element CLE 112 that may be programmed to implement user logic plus a single programmable interconnect element INT 111. A BRAM 103 can include a BRAM logic element (BRL) 113 in addition to one or more programmable interconnect elements.

Typically, the number of interconnect elements included in a tile depends on the height of the tile (as measured from right to left of FIG. 1). In the pictured embodiment, a BRAM tile has the same height as four CLBs, but other numbers (e.g., five) can also be used. A DSP tile 106 can include a DSP logic element (DSPL) 114 in addition to an appropriate number of programmable interconnect elements. An 10B 104 may include, for example, two instances of an input/output logic element IOL 115 in addition to one instance of the programmable interconnect element INT 111. As will be clear to those of skill in the art, the actual I/O pads connected, for example, to the I/O logic element 115 are manufactured using metal layers above the various illustrated logic blocks, and typically are not confined to the area of the input/output logic element 115.

In the pictured embodiment, a columnar area near the center of the die (shown shaded in FIG. 1) is used for configuration, clock, and other control logic. The columnar area may also be utilized to generate on-chip bandgap and regulated voltage references as discussed in more detail below. Horizontal areas 109 extending from this column are used to distribute the clock, voltage reference, and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 may span several columns of CLBs and BRAMs.

Note that FIG. 1 is intended to illustrate only an exemplary FPGA architecture. The number of logic blocks in a column, the relative width of the columns, the number and order of columns, the type of logic blocks included in the columns, the relative size of the logic blocks, and the interconnect/logic implementations 102, 103, and 104 are purely exemplary. For example, in an actual FPGA more than one adjacent column of CLBs is typically included wherever the CLBs appear, to facilitate the efficient implementation of user logic.

Turning to FIG. 2A, an exemplary block diagram is provided that illustrates the voltage regulation architecture that may be implemented within FPGA 100 of FIG. 1. In operation, the voltage regulation architecture of FIG. 2A generates a voltage magnitude, e.g., $V_{GG}$, that is regulated to be proportional to the voltage magnitude generated by one of two bandgap references, e.g., 202 or 204. The proportionality of regulation is programmed by the multiplication factor that is selected by programmable divider 216.

In particular, bandgap reference 202 is configured to generate substantially neutral temperature characteristic (TC) 252 through increasing temperature, as illustrated in FIG. 2B, whereas bandgap reference 204 is configured to generate negative TC 254 through increasing temperature. Comparator 210 and multiplexer 208 interoperate as a selection circuit to select the lower output voltage magnitude as generated by either of bandgap reference 202 or 204. As illustrated in FIG. 2C, the output voltage 258 from bandgap reference 202 is, therefore, selected as the input signal to the inverting input of operational amplifier 212 for temperatures below threshold temperature 256, e.g., 85 degrees C. Alternately, the output voltage 260 from bandgap reference 204 is selected as the input signal to the inverting input of operational amplifier 212 for temperatures above threshold temperature 256, e.g., 85 degrees C.

Operational amplifier 212 accepts the voltage as selected by multiplexer 208 at the inverting input terminal of operational amplifier 212 and accepts the feedback signal from voltage generator 214, as multiplied by programmable divider 216, at the non-inverting input of operational amplifier 212. Operational amplifier 212 then generates an error signal based upon a difference between the selected bandgap voltage and the feedback signal.

The conductivity state of voltage generator 214 and hence the magnitude of regulated voltage, e.g., $V_{GG}$, is selected by the error signal to be proportional to the bandgap reference voltage as selected by multiplexer 208. The degree of proportionality is selected by the multiplication gain factor, as provided by programmable divider 216, in response to the feedback operation of operational amplifier 212. As a result, the regulator that is comprised of operational amplifier 212, voltage generator 214, and programmable divider 216 operates to regulate voltage signal, $V_{GG}$, to be proportional to one of the voltage reference signals provided by either bandgap reference 202 or 204.

Figure 3:
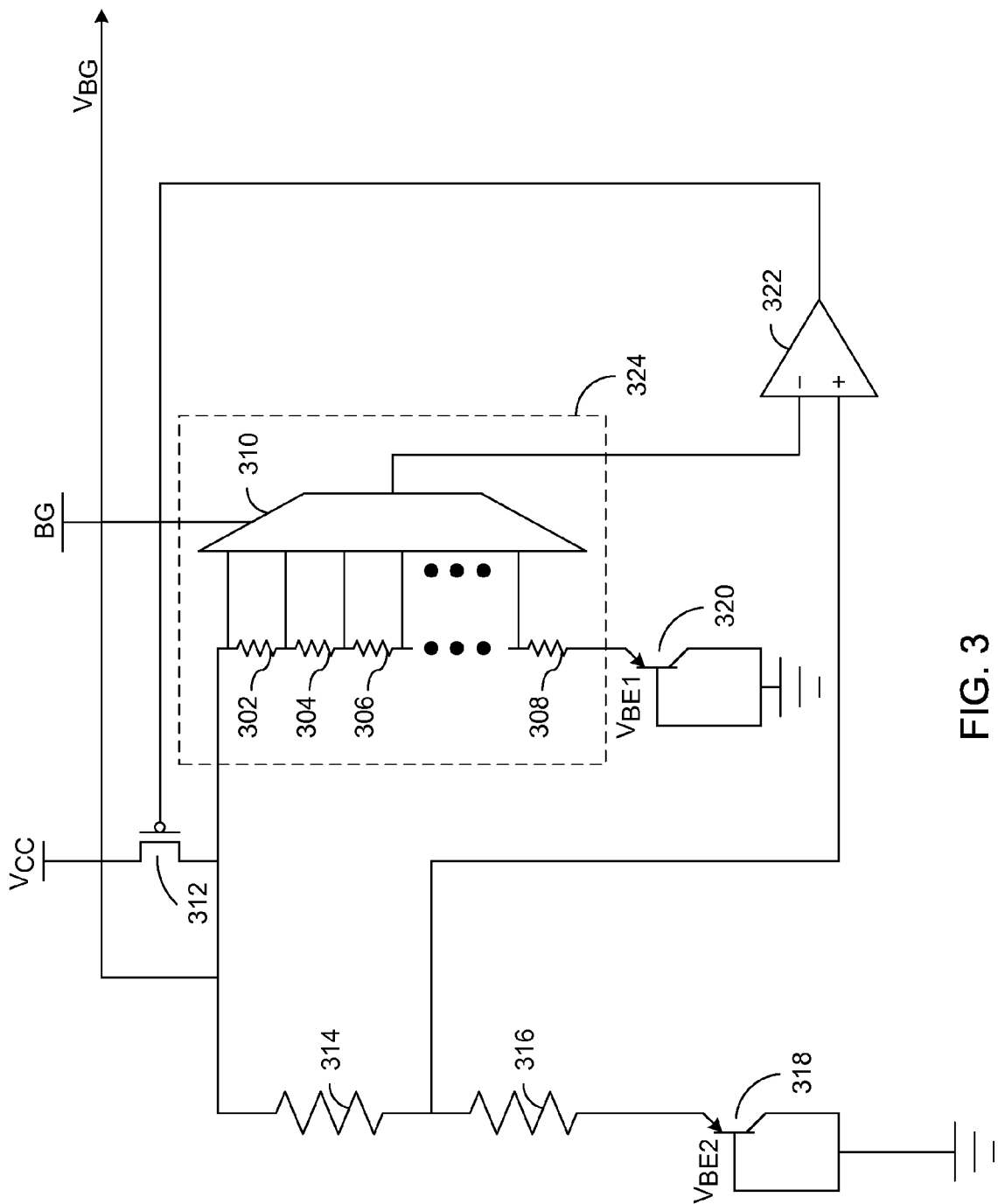
FIG. 3 illustrates a schematic diagram of the bandgap references implemented within the voltage regulation architecture of FIG. 2A.

Turning to FIG. 3, a schematic diagram utilized for bandgap references 202 and 204 is illustrated. Bandgap references 202 and 204 employ programmable divider 324, which in one embodiment, comprises multiplexer 310 coupled to resistor array 302-308 as illustrated. In response to control signal, BG, multiplexer 310 selects a tap point along resistor array 302-308 as the output of multiplexer 310. Hence, a single voltage generated by one of the tap points of the voltage ladder of resistor array 302-308 is provided at the output of multiplexer 310.

The emitter terminal of diode connected transistor 320 is coupled to a second terminal of resistor 308 as illustrated, while the drain terminal of transistor 312 is coupled to a first terminal of resistor 302 and a first terminal of resistor 314 as illustrated. The emitter terminal of diode connected transistor 318 is coupled to a second terminal of resistor 316 as illustrated. Operational amplifier 322 receives the output of multiplexer 310 at the inverting terminal of operational amplifier 322, while the common node between resistors 314 and 316 is coupled to the non-inverting input of operational amplifier 322. The output of operational amplifier 322 is coupled to the gate terminal of transistor 312.

In operation, the bandgap voltage signal, $V_{BG}$, is programmed to have a positive TC, a negative TC, or a substantially neutral TC across increasing temperature. In particular, by programming the tap point selected by multiplexer 310, which programs the voltage divider ratio of programmable divider 324, voltage signal, $V_{BG}$, may exhibit any one of three TCs. As discussed above in relation to FIG. 2A, for example, bandgap reference 202 is programmed to have a substantially neutral TC, while bandgap reference 204 is programmed to have a substantially negative TC.

Diode connected transistors 320 and 318 operate with unequal current densities, where the geometric dimensions of transistor 318 are greater than the geometric dimensions of transistor 320. Accordingly, voltage signal, $V_{BE1}$, at the emitter terminal of transistor 320 exhibits a first negative TC, while voltage signal, $V_{BE2}$, at the emitter terminal of transistor 318 exhibits a second negative TC.

The difference between voltage signal, $V_{BE1}$ and $V_{BE2}$, therefore, yields a positive TC, which is applied across resistive element 316 and multiplied by the ratio of resistive element 314 and resistive element 316. Voltage signal, $V_{BG}$, is equal to the sum of voltage signal, $V_{BE2}$, and the voltages across resistive elements 314 and 316.

In response to programming the resistive ratio of programmable divider 324, the voltage magnitude across resistive element 316 may be modulated by the feedback signal that is applied to the gate terminal of transistor 312. As a result, the TC of voltage signal, $V_{BG}$, may be selected to exhibit a positive TC, a negative TC, or a substantially neutral TC across increasing temperature.

Turning back to FIG. 2A, bandgap references 202 and 204 are programmed via memory cell (MC)/eFuse 222 and 224, respectively, to generate bandgap reference voltages having a substantially neutral TC and a substantially negative TC, respectively. In addition, programmable dividers 206 and 216 are also programmed via memory cell (MC)/eFuse 226 and 228, respectively, so as to enhance the programmable operation of the voltage regulation architecture of FIG. 2A.

In one embodiment, the logic states of control signals BG #1, BG #2, DIV #1, and DIV #2 may first be generated via a PLD configuration controller as configured during a configuration event of FPGA 100. Through boundary scan and configuration event iteration, final logic states of control signals BG #1, BG #2, DIV #1, and DIV #2 may be determined. Once the final logic states of the control signals are determined, eFuses may be blown by the PLD configuration controller to generate the final control signals as determined during the boundary scan and configuration event iterations.

Figure 4:
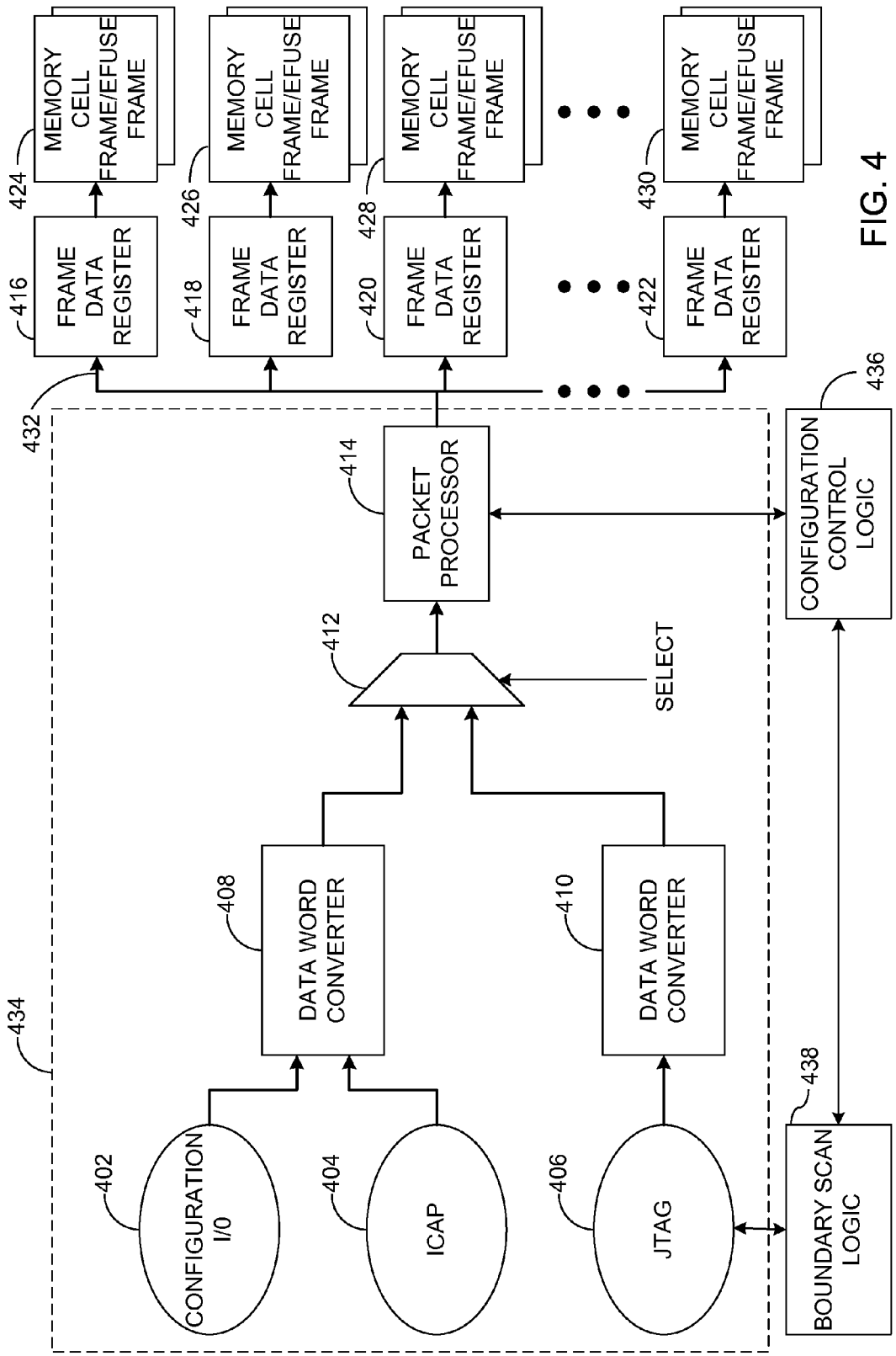
FIG. 4 illustrates a programmable logic device configuration controller.

Turning to FIG. 4, an exemplary PLD configuration controller is exemplified, whereby configuration data router 434 facilitates the propagation of configuration data into the configuration memory space that is comprised of frame data registers 416-422 and memory cell/eFuse frame sets 424-430 of a PLD, such as FPGA 100. Configuration data router 434 is comprised of configuration interfaces 402-406, data word converters 408-410, multiplexer 412, and packet processor 414.

To program the configuration memory space, instructions for configuration control logic 436 and data for the configuration memory space are provided in the form of a configuration bitstream, which is delivered to configuration control logic 436 and the configuration memory space via configuration data router 434. Boundary scan operations are facilitated through boundary scan logic 438, where configuration control logic 436 and boundary scan logic 438 interoperate to perform configuration event/boundary scan operations that select the logic states of memory cell/eFuse frame sets 424-430, which then provide control signals, e.g., BG #1, BG #2, DIV #1, and DIV #2 of FIG. 2A.

Configuration memory is arranged in multiple sets of memory cell/eFuse frames that are tiled about FPGA 100, whereby each memory cell/eFuse frame set represents an entire row of configuration memory cells and eFuses configured in parallel. For example, the first memory cell/eFuse frame of memory cell/eFuse frame set 424 configures the first column of the first row of configuration memory cells or eFuses within the configuration memory space, the second memory cell/eFuse frame of memory cell/eFuse frame set 424 configures the second column of the first row of configuration memory cells or eFuses within the configuration memory space, and so on. Memory cell/eFuse frame sets 426-430 are similarly arranged, such that memory cell/eFuse frame set 426 configures the multiplicity of columns contained within the second row of the configuration memory space, memory cell/eFuse frame set 428 configures the multiplicity of columns contained within the third row of the configuration memory space, and memory cell/eFuse frame set 430 ultimately configures the multiplicity of columns contained within the last row of the configuration memory space.

The height of each frame of memory cells/eFuses is determined by the particular generation of PLD. Earlier FPGAs, for example, require the height of the configuration memory cell/eFuse frames to be equal to the height of the device itself. More recent FPGA generations, however, divide the height of the device into two or more rows, whereby each configuration memory cell/eFuse frame is mapped into a configuration memory cell/eFuse column and a configuration memory cell/eFuse row as discussed above. In such an instance, a single frame of configuration data is addressed to a particular column and row within the configuration memory space, whereby each single frame of configuration data is comprised of, for example, 41, 32-bit data words for a total of 1312 bits per configuration memory frame. It is understood, however, that configuration memory frame sizes are device dependent and may be adapted to be any size as may be required by the particular device being configured.

Configuration I/O 402 may be configured to transfer the configuration bitstream either serially, or in configurable data widths of, e.g., 8, 16, or 32 bits. In particular, configuration I/O 402 may include a serial configuration programmable read only memory (PROM) that stores the configuration data and then transfers the configuration data to FPGA 100 in response to a configuration clock signal. In a serial transfer mode, a single configuration bit may be transferred for each configuration clock cycle. Conversely, a parallel transfer mode may be used to transfer the configuration data in multiple bit data words, e.g., 8, 16, or 32-bit data words, for each configuration clock cycle.

Data word converter 408 then receives the configuration data from configuration I/O 402 and converts the configuration data into a pre-determined word width of, for example, 32 bits, where the pre-determined word width is selected to be compatible with multiplexer 412, packet processor 414, and frame data registers 416-422. Packet processor 414 then sequentially transfers a frame of configuration data words, e.g., 41, 32-bit configuration data words, to one of frame data registers 416-422 that is addressed by configuration control logic 436, where the addressed frame data register corresponds to the row of the configuration memory space that is being reconfigured. The addressed frame data register then transfers the configuration data frame to the memory cell frame that is addressed by configuration control logic 436, where the addressed memory cell frame corresponds to the particular column of the particular row of the configuration memory space that is being configured. Once written, the configuration data frame may then be verified by reversing the sequence of configuration data transfers.

Internal configuration access port (ICAP) 404 provides an alternate configuration interface, which is internal to FPGA 100. ICAP 404, therefore, obviates the need to use an external configuration interface as discussed above in relation to configuration I/O 402. Instead, ICAP 404 represents an internally accessed resource containing configuration data, which is then processed into configuration data frames as discussed above.

Joint test action group (JTAG) interface 406 supports configuration of FPGA 100 via the IEEE 1532 standard for in-system configuration (ISO), based on the IEEE 1149.1 standard. JTAG interface 406 provides a single pin that provides the serial input to all JTAG and instruction registers (not shown) in response to the JTAG test clock signal. An instruction register (not shown) is then used to receive an operational code that configures JTAG interface 406 for an ISO operation, whereby the serial input provided by JTAG interface 406 provides the configuration bitstream to data word converter 410. The serial configuration bitstream is then converted to, e.g., 32-bit words, via data word converter 410, similarly as discussed above in relation to data word converter 408. The configuration data words are then provided to packet processor 414 via multiplexer 412 for sequential distribution to frame data registers 416-422 and memory cell/eFuse frames 424-430 as discussed above.

Test access ports (TAPs) (not shown) may also be made available via JTAG interface 406, such that the magnitude of voltage signal, e.g., $V_{GG}$, may be measured and communicated to boundary scan logic 438. Once communicated, the measurement may be analyzed by boundary scan logic 438 to determine whether another configuration event is necessary. If necessary, configuration control logic 436 may then be commanded by boundary scan logic 438 to implement an additional configuration event as discussed above.

Figure 5:
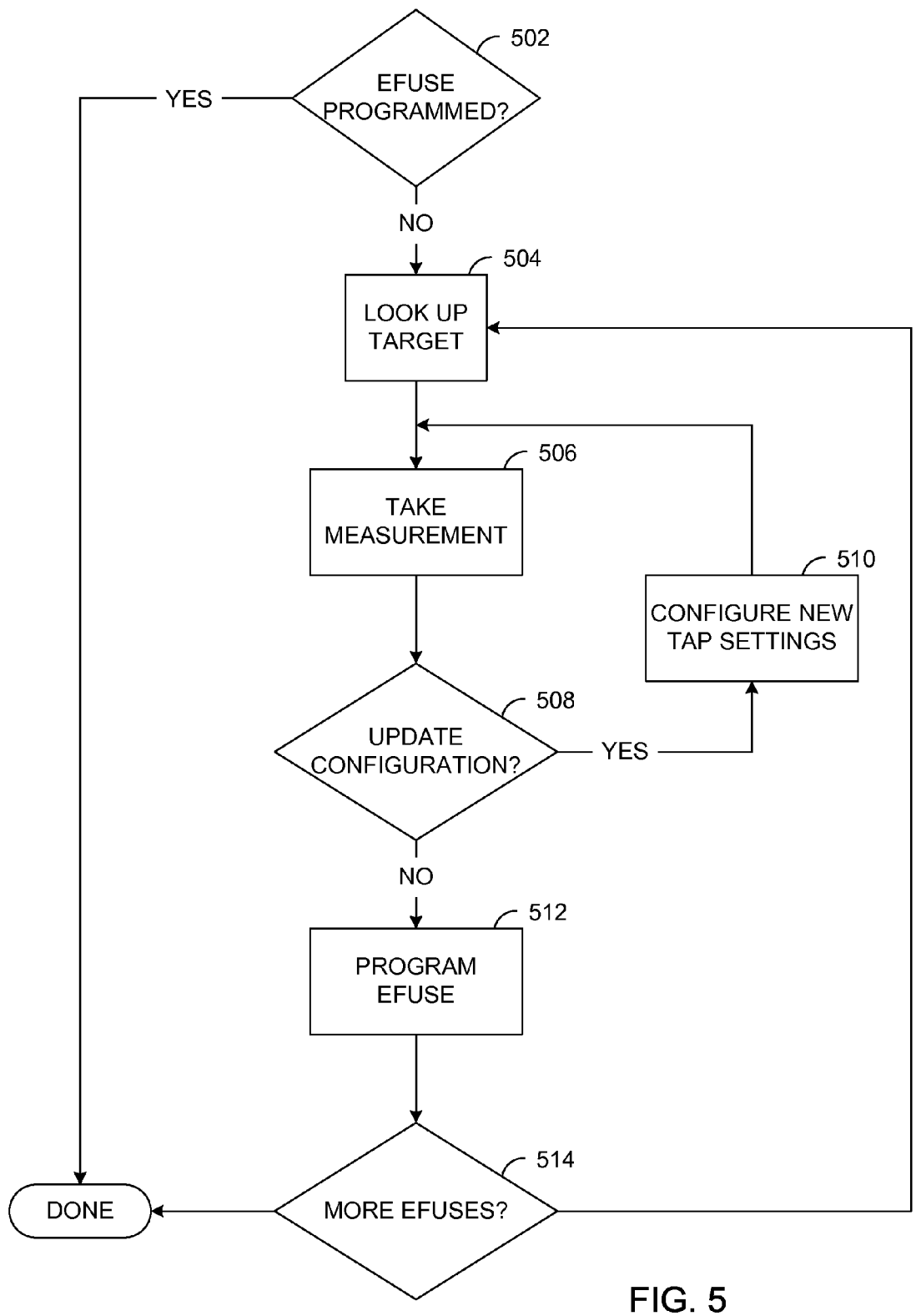
FIG. 5 illustrates a flow diagram of a method of programming the voltage reference circuits of the voltage regulation architecture of FIG. 2A.

Turning to FIG. 5, a flow diagram of a method of programming bandgap references 202,204 and programmable dividers 206,216 in response to, e.g., measurement of the magnitude of voltage signal, $V_{GG}$, is illustrated. In step 502, a determination is made as to whether any of eFuses, e.g., 222-228 of FIG. 2A, have been previously programmed. If all of the eFuses have been previously programmed, then no further programming is required and the process terminates.

If, on the other hand, at least one eFuse remains to be programmed, then step 504 is executed to determine a target voltage magnitude that is required. For example, a lookup table may be utilized that is indexed by the current operational temperature of the integrated circuit, whereby the target magnitude of voltage signal, e.g., $V_{GG}$, as regulated to bandgap reference 202 or 204 at the current temperature is ascertained. It is noted that the current operational temperature of the integrated circuit is used to determine which of bandgap references 202 or 204 is to be programmed, since as discussed above, bandgap reference 202 generates the bandgap reference for temperatures below threshold voltage 256 and bandgap reference 204 generates the bandgap reference for temperatures above threshold voltage 256.

Boundary scan logic 438 and JTAG interface 406 may then be utilized, as discussed above, to measure the actual magnitude of voltage signal, e.g., $V_{GG}$, as in step 506. If the actual magnitude of voltage signal, e.g., $V_{GG}$, differs from the target magnitude previously ascertained, then a determination is made in step 508 as to whether the error voltage is larger or smaller than a predetermined program resolution.

For example, the number of control bits for control signal, e.g., BG #1 of FIG. 2A, may be equal to, e.g., 6. The target magnitude for voltage signal, e.g., $V_{GG}$, may be equal to, e.g., 1.5 V at 85 degrees C., per a lookup table entry. The corresponding resolution at 85 degrees C. may be equal to, e.g., 0.0048V, per a lookup table entry. The actual voltage magnitude measured may be equal to, e.g., 1.478 V, which yields an error voltage magnitude of: 1.5−1.478=0.022 V.

Dividing the error voltage magnitude by the resolution yields an offset value of 5, which suggests that a reconfiguration of control signal, e.g., BG #1, through a configuration event yields a reduction in the error voltage magnitude by approximately 5*0.0048=0.024 V. Accordingly, the current tap setting, i.e., the value of the 6-bit control word for control signal, BG #1, is determined to be modified in step 510 by the offset value of 5, which is accomplished by a configuration event as discussed above.

Boundary scan logic 438 and JTAG interface 406 may again be utilized, as discussed above, to measure the reprogrammed magnitude of voltage signal, e.g., $V_{GG}$ (as regulated to bandgap reference 202 or 204), as in step 506. If the reprogrammed magnitude of voltage signal, e.g., $V_{GG}$, differs from the target magnitude previously ascertained, then a determination is made as to whether the error voltage is larger or smaller than a predetermined program resolution.

If the anticipated error voltage reduction of 0.024 V is effected by configuration step 510, then no further reprogramming is necessary and the final tap setting for control signal, BG #1, may be finally programmed in step 512 via eFuse programming as discussed above. If, on the other hand, the anticipated error voltage reduction of 0.024 V is not effected and further reprogramming is necessary, then steps 506-510 may be repeated as necessary until either an acceptable error voltage is obtained, or until a maximum number of iteration steps have been executed.

Turning to FIGS. 6A-6E, exemplary voltage waveforms across temperature are illustrated that exhibit the programmability of the voltage regulation architecture of FIG. 2A using the programming procedure as discussed above in relation to FIGS. 2A-2C and 5. As discussed above, for example, comparator 210 and multiplexer 208 interoperate as a selection circuit to select the lower output voltage magnitude as generated by either of bandgap reference 202 or 204. The output voltage 258 from bandgap reference 202 is, therefore, selected for temperatures at or below threshold temperature 256, e.g., 85 degrees C., while the output voltage 260 from bandgap reference 204 is selected for temperatures above threshold temperature 256, e.g., 85 degrees C., as illustrated in FIG. 2C.

Figure 6A:
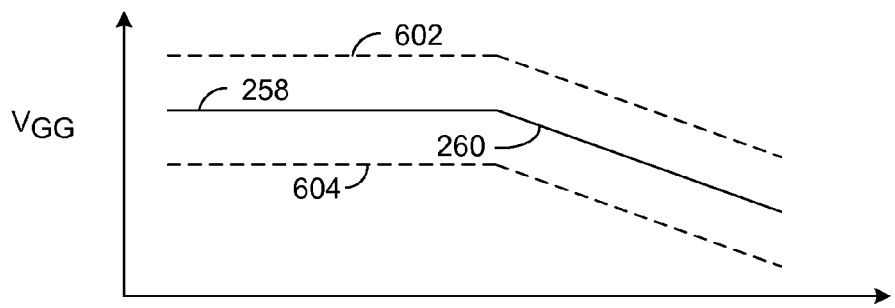
FIGS. 6A-6E illustrate voltage waveforms as generated by the voltage regulation architecture of FIG. 2A and the associated programmable ranges that may be affected by the flow diagram of FIG. 5.

FIG. 6A is similar to the voltage waveform of FIG. 2C, whereby the magnitude of voltage waveforms 258 and 260 may be programmed to upper limit 602 or lower limit 604 by programming the corresponding control bit settings for control signal, DIV #2, via MC/eFuse 228 as discussed above in relation to FIG. 5. In particular, programmable divider 216 selects the voltage regulation gain of the voltage regulation architecture of FIG. 2A. Maximum gain yields a voltage waveform similar to upper limit 602, whereas a minimum gain yields a voltage waveform similar to lower limit 604.

Figure 6B:
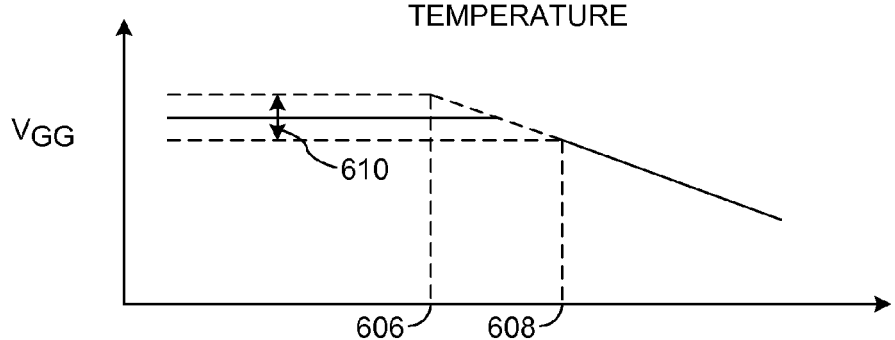

FIG. 6B illustrates the programmability of the voltage regulation architecture of FIG. 2A, whereby the knee temperature, e.g., 606 and 608, may be adjusted. In other words, the bandgap reference voltage, $V_{BG1}$, is selected for temperatures below the knee temperature and bandgap reference voltage, $V_{BG2}$, is selected for temperatures above the knee temperature. The temperature at which the switch between bandgap reference voltage $V_{BG1}$ and $V_{BG2}$ occurs, i.e., the knee temperature, is selected by adjusting the magnitude of bandgap reference voltage, $V_{BG1}$, up or down in direction 610 as illustrated.

For example, programming the corresponding control bit settings for control signal, DIV #1, via MC/eFuse 226, as discussed above in relation to FIG. 5, adjusts the magnitude of bandgap reference voltage, $V_{BG1}$, in direction 610. Maximum gain yields a maximum magnitude of bandgap reference voltage, $V_{BG1}$, which selects temperature knee, e.g., 606. A minimum gain yields a minimum magnitude of bandgap reference voltage, $V_{BG1}$, which selects temperature knee, e.g., 608.

Figure 6C:
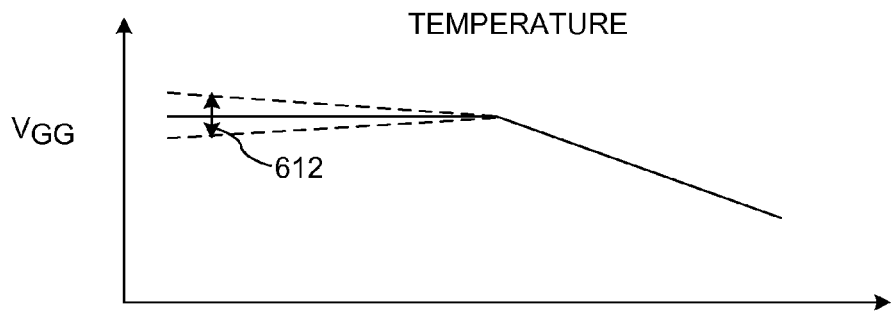

FIG. 6C illustrates the programmability of the voltage regulation architecture of FIG. 2A, whereby the slope of voltage waveform segment 258 may be adjusted. For example, by programming the corresponding control bit settings for control signal, DIV #1, via MC/eFuse 226, and control signal BG #1, via MC/eFuse 222, as discussed above in relation to FIG. 5, the slope of voltage waveform segment 258 is adjusted to exhibit a range between a positive TC and a negative TC, as illustrated by range 612, while maintaining a substantially constant knee temperature.

Figure 6D:
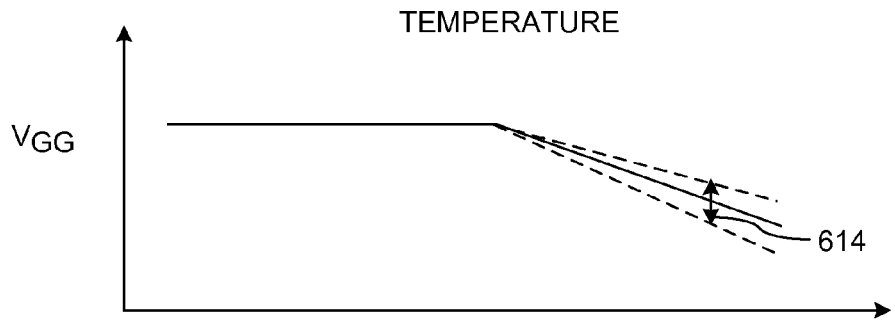

FIG. 6D illustrates the programmability of the voltage regulation architecture of FIG. 2A, whereby the slope of voltage waveform segment 260 may be adjusted. For example, by programming the corresponding control bit settings for control signal, DIV #1, via MC/eFuse 226, control signal, BG #2, via MC/eFuse 224, and control signal, DIV #2, via MC/eFuse 228, as discussed above in relation to FIG. 5, the slope of voltage waveform segment 260 may be adjusted, as illustrated by range 614, while maintaining a substantially constant knee temperature.

Figure 6E:
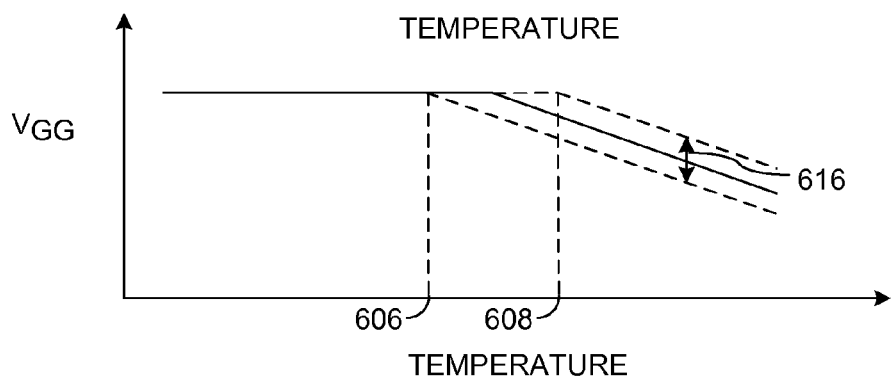

FIG. 6E illustrates the programmability of the voltage regulation architecture of FIG. 2A, whereby an alternate embodiment of adjusting the knee temperature, e.g., 606 and 608, is provided. For example, programming the corresponding control bit settings for control signal, DIV #1, via MC/eFuse 226, and DIV #2, via MC/eFuse 228, as discussed above in relation to FIG. 5, adjusts voltage waveform segment 260 in direction 616. The temperature at which the switch between bandgap reference voltage $V_{BG1}$ and $V_{BG2}$ occurs, i.e., the knee temperature, is selected by adjusting the magnitude of bandgap reference voltage, $V_{BG2}$, up or down in direction 616 as illustrated.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of programming a voltage reference circuit within an integrated circuit, the method comprising:
   obtaining a target voltage magnitude;
   performing a boundary scan to measure an actual voltage magnitude generated by the voltage reference circuit;
   iterating a configuration bit setting of the integrated circuit to program the actual voltage magnitude generated by the voltage reference circuit to within an acceptable error magnitude as compared to the target voltage magnitude; and
   programming an eFuse with the iterated configuration bit setting to permanently program the actual voltage magnitude to within the acceptable error magnitude.

2. The method of claim 1, wherein obtaining a target voltage magnitude comprises using a lookup table indexed to a current operational temperature of the integrated circuit to find the target voltage magnitude.

3. The method of claim 2, further comprising selecting one voltage reference circuit from a plurality of voltage reference circuits to be programmed, wherein the selection is based upon the current operational temperature of the integrated circuit.

4. The method of claim 3, wherein performing a boundary scan to measure an actual voltage magnitude generated by the voltage reference circuit comprises utilizing a test access port to measure the voltage magnitude generated by the selected voltage reference circuit.

5. The method of claim 4, wherein iterating a configuration bit setting of the integrated circuit to program the actual voltage magnitude generated by the voltage reference circuit comprises comparing the voltage magnitude generated by the selected voltage reference circuit to the target voltage magnitude to determine an error magnitude.

6. The method of claim 5, wherein iterating a configuration bit setting of the integrated circuit to program the actual voltage magnitude generated by the voltage reference circuit further comprises determining whether a programming resolution of the selected voltage reference circuit is less than the error magnitude.

7. The method of claim 6, wherein iterating a configuration bit setting of the integrated circuit to program the actual voltage magnitude generated by the voltage reference circuit further comprises dividing the error magnitude by the programming resolution of the selected voltage reference circuit to determine a subsequent configuration bit setting.

8. The method of claim 7, wherein iterating a configuration bit setting of the integrated circuit to program the actual voltage magnitude generated by the voltage reference circuit further comprises configuring the integrated circuit with the subsequent configuration bit setting to reprogram the selected voltage reference circuit.

9. The method of claim 8, wherein programming an eFuse with the iterated configuration bit setting to permanently program the actual voltage magnitude to within the acceptable error magnitude comprises using the subsequent configuration bit setting to program an eFuse associated with the selected voltage reference circuit.

10. The method of claim 9, wherein the eFuse associated with the first voltage reference circuit is programmed to select a tap point along a resistor array to program the actual voltage magnitude generated by the selected voltage reference circuit.

11. A voltage regulation circuit, comprising:
    a first bandgap reference configured to provide a first bandgap voltage having a first temperature characteristic, the first temperature characteristic being programmed by a first configuration bit setting;
    a second bandgap reference configured to provide a second bandgap voltage having a second temperature characteristic, the second temperature characteristic being programmed by a second configuration bit setting;
    a selection circuit coupled to the first and second bandgap references, the selection circuit configured to select the first bandgap voltage when a temperature of the voltage regulation circuit is below a threshold temperature and select the second bandgap voltage when the temperature of the voltage regulation circuit is above the threshold temperature; and
    a regulator coupled to receive the selected bandgap voltage and configured to regulate an output voltage of the regulator circuit to be proportional to the selected bandgap voltage.

12. The voltage regulation circuit of claim 11, wherein the first bandgap reference comprises:
    a first programmable divider coupled to receive a first regulated supply voltage and a first reference voltage and configured to provide a first divided voltage in response to the first configuration bit setting, the first divided voltage having a magnitude that is lower than a magnitude of the first regulated supply voltage and higher than a magnitude of the first reference voltage; and
    a first operational amplifier coupled to receive the first divided voltage and a second reference voltage and configured to provide a first feedback signal to regulate the first regulated supply voltage.

13. The voltage regulation circuit of claim 12, wherein the second bandgap reference comprises:
    a second programmable divider coupled to receive a second regulated supply voltage and a third reference voltage and configured to provide a second divided voltage in response to the second configuration bit setting, the second divided voltage having a magnitude that is lower than the second regulated supply voltage and higher than the third reference voltage; and
    a second operational amplifier coupled to receive the second divided voltage and a fourth reference voltage and configured to provide a second feedback signal to regulate the second regulated supply voltage.

14. The voltage regulation circuit of claim 13, further comprising a third programmable divider coupled to receive the first bandgap voltage and configured to multiply the first bandgap voltage by a gain factor in response to a third configuration bit setting.

15. The voltage regulation circuit of claim 14, wherein the selection circuit comprises:
    a comparator coupled to receive the first and second bandgap voltages and configured to provide a control signal in response to a comparison of the first and second bandgap voltages; and
    a multiplexer coupled to receive the first and second bandgap voltages and the control signal and configured to select one of the first and second bandgap voltages to be provided at an output of the multiplexer in response to the control signal.

16. The voltage regulation circuit of claim 15, wherein the regulator comprises:
    a third operational amplifier coupled to receive the selected bandgap voltage at a first input and a feedback signal at a second input and configured to provide an error signal in response to a difference between a magnitude of the selected bandgap voltage and a magnitude of the feedback signal;

a voltage generator coupled receive the error signal and configured to provide the regulated output voltage in response to the error signal; and a fourth programmable divider coupled to receive the regulated output voltage and configured to multiply the regulated output voltage by a gain factor in response to a fourth configuration bit setting.

17. The voltage regulation circuit of claim 16, further comprising first, second, third, and fourth memory cells configured to provide the first, second, third, and fourth configuration bit settings during iterated configuration events.

18. The voltage regulation circuit of claim 17, further comprising first, second, third, and fourth eFuses configured to provide the first, second, third, and fourth configuration bit settings during final operation of the voltage regulation circuit.

19. A method of programming on-chip voltage generation circuits, the method comprising:

programming a first bandgap reference to generate a first bandgap signal exhibiting a substantially neutral temperature characteristic;

programming a second bandgap reference to generate a second bandgap signal exhibiting a substantially negative temperature characteristic;

programming a magnitude of the first bandgap signal to be equal to a magnitude of the second bandgap signal when the temperature reaches a threshold temperature;

regulating an output voltage in proportion to the first bandgap signal when the temperature is less than the threshold temperature; and regulating the output voltage in proportion to the second bandgap signal when the temperature is greater than the threshold temperature.

20. The method of claim 19, further comprising programming a regulation gain when regulating the output voltage to the first and second reference signals.

* * * * *